(12) United States Patent
Meyer et al.

(10) Patent No.: US 6,572,916 B1
(45) Date of Patent: Jun. 3, 2003

(54) COATING METHOD FOR USE IN A PROCESS FOR PRODUCING HIGH-TEMPERATURE SUPERCONDUCTIVE STRIP CONDUCTORS

(75) Inventors: Arnold Meyer, St. Michaelisdonn (DE); Jens Müller, Remscheid (DE); Bernhard Fischer, Bruchköbel (DE); Stefan Kautz, Rückersdorf (DE); Bernhard Roas, Heidenheim (DE); Helmut Helldörfer, Nuremberg (DE)

(73) Assignee: Vacuumschmelze GmbH (DE)

( * ) Notice: Subject to any disclaimer, the term of this patent is extended or adjusted under 35 U.S.C. 154(b) by 0 days.

(21) Appl. No.: 09/647,564
(22) PCT Filed: Mar. 30, 1999
(86) PCT No.: PCT/DE99/00962
§ 371 (c)(1), (2), (4) Date: Jan. 4, 2001
(87) PCT Pub. No.: WO99/52156
PCT Pub. Date: Oct. 14, 1999

(30) Foreign Application Priority Data

Apr. 3, 1998 (DE) .......................................... 198 15 096

(51) Int. Cl.[7] ............................ B05D 5/12; H01C 39/24
(52) U.S. Cl. ...................... 427/62; 427/126.4; 427/560; 505/430; 505/440
(58) Field of Search ....................... 427/62, 307, 126.4, 427/383.1, 383.5, 560; 505/430, 440

(56) References Cited

U.S. PATENT DOCUMENTS 5,047,388 A  *  9/1991  Rohr et al. ..................... 505/1

FOREIGN PATENT DOCUMENTS

| EP | 0044144 | 1/1982 |
| EP | 322619 | * 7/1989 |
| EP | 0803917 | 10/1997 |

* cited by examiner

Primary Examiner—Brian K. Talbot
(74) Attorney, Agent, or Firm—Dean W. Russell; Kilpatrick Stockton LLP

(57) ABSTRACT

Coatings especially for superconductive strip conductors, as well as methods of applying the coatings, are addressed. Exemplary coatings include aluminum oxide in an aqueous suspension, with aluminum oxide particles contained in the suspension having size typically between 0.5–10 μm.

14 Claims, 1 Drawing Sheet

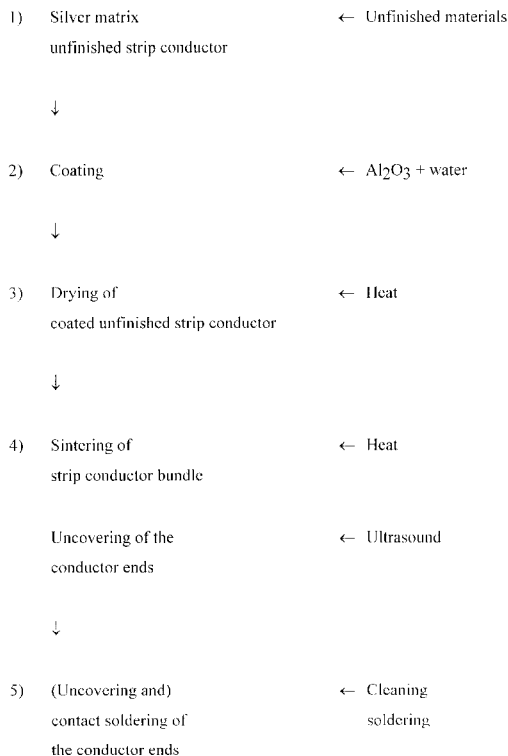

Flow Diagram:

1) Silver matrix  ← Unfinished materials
   unfinished strip conductor

↓

2) Coating  ← $Al_2O_3$ + water

↓

3) Drying of  ← Heat
   coated unfinished strip conductor

↓

4) Sintering of  ← Heat
   strip conductor bundle

Uncovering of the  ← Ultrasound
   conductor ends

↓

5) (Uncovering and)  ← Cleaning
   contact soldering of      soldering
   the conductor ends

COATING METHOD FOR USE IN A PROCESS FOR PRODUCING HIGH-TEMPERATURE SUPERCONDUCTIVE STRIP CONDUCTORS

The present invention relates to a coating method for use in a process for producing high-temperature superconductive strip conductors, which are required for high-temperature superconductor cables.

From the prior art,
1) IEEE Trans. Appl. Supercond. Vol. 5, No. 2 (1995), pp. 953–955,
2) Funjikamik et al. "5m/2 KA High-TC-Cable Conductor," Adv. in Superconductivity V, pp. 1251–1254, Springer-Verlag 1993 (Transactions of the 5th International Symposium on Superconductivity, 1992),
3) Sato et al. "Electromagnetic Properties and Structures of BiPbSrCaCuO Superconducting Wires," Advances in Superconductivity II, pp. 335–340, Springer-Verlag, 1990 (Transactions 2nd Int. Symp. on Superconductivity, 1989), high-temperature superconductor cables that are composed of a plurality of strip conductors are known. These strip conductors, in turn, are made of a known high-temperature superconducting ceramic material, e.g., $(Bi,Pb)_2 Sr_2Ca_2CU_3O_x$, which is preferably contained in a silver matrix. In the finished cable, these silver matrix strip conductors are applied, e.g., stranded, to a carrier, e.g., a corrugated tube, and are soldered at their ends for contact.

From EPO 044 144 B1 it is known to provide conductors with an insulating ceramic outside layer to insulate the filamentary superconductor wires made of an intermetallic compound electrically with respect to one another, so that they can be wound into a magnet coil. This outer layer on the wires is produced in situ by applying an aqueous suspension of sodium silicate, kaolin and calcium carbonate, drying it and heat-treating it at a temperature in excess of 500° C.

EP 0 322 619 A1 describes the application of a film between a carrier made, e.g., of strontium titanate, or also a metal, and its coating made of an oxide ceramic high-temperature superconducting material to ensure good adhesion between carrier and coating and prevent chemical reactions and interactions between carrier material and oxide ceramic material. For this interlayer, this document specifies aluminum oxide, among others, which is deposited on the carrier surface in the form of an alcoholic suspension and is sintered at 950° C. to obtain a permanent connection with the carrier material.

In the production process, these strip conductors are sintered in known manner at correspondingly high temperatures. The strip conductors, or parts of these long strip conductors (several 100 m long) are helically wound onto an annealing base and are annealed lying next to one another. To prevent the strip conductors from sticking together or adhering during the required annealing processes, a coating of preferably aluminum oxide is provided on each individual strip conductor. This measure prevents the individual layers/windings of this strip conductor from sticking together/adhering at high temperatures in excess of 800° C., at which the mechanical loadability of the silver is low.

To produce a superconductor cable, the finished strip conductors must be wound individually and bonded to corresponding terminals. For electrical bonding of each end of such a superconductor cable with terminals, the cable end and the terminal must be soldered together. For this purpose, it must be possible reliably to solder the individual strip conductors to the terminal. This is prevented, however, by the otherwise required aluminum oxide coating of the strip conductors. A solution must therefore be found to correct this incompatibility.

The object of the present invention is to define a solution that will prevent the strip conductors from sticking together during the annealing process and will simplify soldering for subsequent bonding of the strip conductors.

Such a solution as well as further developments and additional embodiments are set forth in claim 1 and the dependent claims.

For the soldering process to bond the strip conductors after the production process of the strip conductors and their annealing processes, the present invention provides that the aluminum oxide used for coating the strip conductors, which is necessary per se, be specifically selected. It was found that the subsequent soldering process is decisively facilitated if an aluminum oxide in an aqueous suspension is used, with the finely distributed aluminum oxide particles contained in the suspension having a particle size of no more than about 0.5 $\mu$m to about 10 $\mu$m. Preferably, the suspension is deposited in such a way that it (initially) results in a film thickness on the strip conductor of about 10 $\mu$m (maximum). The selected aqueous suspension is applied to the silver matrix strip conductor, e.g., in a continuous process. Care should be taken that no (residues of) solvent(s), which are, or might be, used for cleaning, remain on the surface of the strip conductor. This would increase the surface tension with respect to the suspension to the point where a nearly closed coating with the provided suspension is no longer possible. Coarse contamination of the silver surface should also be avoided.

According to a variant of the invention, it may also be provided, however, that the aluminum oxide coating to be produced on the conductor strip be made so thin that it is porous. Such porosity can also serve, in particular, to contact the strip conductor material directly with the subsequently used solder without first having to influence the applied film mechanically.

For environmental reasons, it is advantageous according to the invention to use an aqueous suspension.

The suspension described above is applied to the surface of each strip conductor and subsequently dried in a continuous annealing furnace at temperatures in excess of 100° C., e.g., at about 600° C.

It is preferred to use aluminum oxide that contains crystallization water in the alumina particles. With the use of the aforementioned high temperatures, outgassing of the crystallization water occurs at temperatures in excess of 500° C., which can also lead to a certain porosity of the finished aluminum oxide coating. It also causes the adhesion characteristics of the aluminum oxide particles of the coating on the silver surface of the strip conductor to be less strong according to the invention, so that the coating can subsequently, i.e. for the following soldering process, but also between the individual annealing treatments, be readily removed again at the soldering point by an ultrasound treatment of several minutes.

It may be advantageous if the strip conductor, i.e. the silver, is slightly roughened prior to applying the suspension. After applying/producing the coating and prior to soldering, it may be advantageous to clean each strip conductor at the soldering point by means of solvents, acids or the like, particularly by means of acetone, and to apply the solder directly.

It may also be provided that after sintering, the aluminum oxide coating (which is no longer required after the sintering process) be at least partially removed again from the corresponding strip conductor along the conductor's entire length. This for the purpose of inspecting the strip conductor in a continuous process for its properties and the possibility of further enhancing or equalizing its mechanical and/or electrical properties by subsequent foreign metal diffusion into the silver in a known process.

The flow diagram described below is intended to provide an overview of the inventive method. Step 1 comprises the known process of assembling, pressing, extruding, etc. the yet unsintered strip conductor into a silver matrix. The second step, after the selection of the aluminum oxide and the process parameters according to the invention, comprises the coating of the strip conductor with the inventive aqueous aluminum oxide suspension with a particle size according to the invention.

In the third step the suspension is dried to produce the solid coating.

The fourth step provides for one-time, but preferably multiple, sintering of the helically arranged strip conductor or strip conductor bundle.

The fifth step concerns the exposure of the strip conductor ends and contact soldering of the strip conductors to one another and/or to the terminals at the cable end According to a further development of the invention, during the fourth step, i.e. after the individual annealing treatments, as well as between the fourth and fifth step, an ultrasound treatment of the strip conductor ends may be optionally included as described.

What is claimed is:

1. Method for producing high-temperature superconducting silver matrix strip conductors for high-temperature superconductor cables with an at least temporary aluminum oxide coating, comprising applying to the strip conductors a coating of aluminum oxide in the form of a water-based suspension of finely distributed aluminum oxide particles with a particle size of 0.5 $\mu$m to 10 $\mu$m in a film thickness of up to 10 $\mu$m, such suspension omitting any flammable solvents, and subsequently drying the suspension adhering to the strip conductors at a temperature in excess of 100° C.

2. Method as claimed in claim 1, in which the drying is carried out at approximately 600° C.

3. Method as claimed in claim 1, in which prior to applying the suspension, the strip conductors to be coated are cleaned while avoiding the use of acetonic or alcoholic solvents.

4. Method as claimed in claim 1, in which prior to applying the suspension, the strip conductors are roughened.

5. Method as claimed in claim 1, further comprising cleaning with a solvent, at soldering points, the coated strip conductors.

6. Method as claimed in claim 5, in which the solvent used is acetone.

7. Method as claimed in claim 1, further comprising cleaning with an acid, at soldering points, the coated strip conductors.

8. Method as claimed in claim 1, in which the aluminum oxide comprises water of constitution and alumina particles, with the water of constitution being outgassed from the coating when drying at temperatures in excess of 500° C.

9. Method as claimed in claim 1, in which the coating on the strip conductors is sintered when drying at temperatures of up to 900° C.

10. Method as claimed claim 1, in which the coating on the strip conductors is sintered when drying at temperatures of up to 820° C.

11. Method as claimed in claim 1, further comprising using ultrasound to remove the coating from a part of at least one of the strip conductors.

12. Method as claimed in claim 11, further comprising using ultrasound to remove the coating at defined soldering points of at least one of the strip conductors.

13. Method as claimed in claim 1, further comprising removing the coating from the entire strip conductors after the drying step.

14. Method as claimed in claim 13, in which, after removing the coating, foreign metals are diffused into the strip conductors.

* * * * *